United States Patent [19]

Glass et al.

[11] 4,263,374

[45] Apr. 21, 1981

[54] TEMPERATURE-STABILIZED LOW-LOSS FERRITE FILMS

[75] Inventors: Howard L. Glass, Orange; Michael T. Elliott, Cypress; Rodney D. Henry, Saratoga, all of Calif.

[73] Assignee: Rockwell International Corporation, El Segundo, Calif.

[21] Appl. No.: 918,298

[22] Filed: Jun. 22, 1978

[51] Int. Cl.[3] .................... G11C 11/02

[52] U.S. Cl. .................... 428/693; 252/62.57; 252/62.58; 365/33; 428/900

[58] Field of Search .................... 428/539, 900, 212; 365/33, 34; 156/605, 606; 357/63, 60; 252/62.57, 62.58

[56] References Cited

U.S. PATENT DOCUMENTS

| | | | |
|---|---|---|---|
| 3,125,534 | 3/1964 | Zneimer et al. | 252/62.57 |
| 3,132,105 | 5/1964 | Harrison et al. | 252/62.57 |
| 3,193,502 | 7/1965 | Scheiber | 252/62.57 |
| 3,486,937 | 12/1969 | Linares | 252/62.57 |
| 3,495,189 | 2/1970 | Le Craw | 332/51 R |
| 3,496,108 | 2/1970 | Kolb et al. | 252/62.58 |
| 3,792,452 | 2/1971 | Dixon et al. | 252/62.57 |
| 3,995,093 | 11/1976 | Heinz | 428/539 |
| 4,018,692 | 4/1977 | Akselrad et al. | 252/62.57 |
| 4,034,358 | 7/1977 | Blunk | 252/62.57 |
| 4,139,905 | 2/1979 | Blunk et al. | 156/605 |
| 4,139,905 | 2/1979 | Blunk et al. | 156/605 |
| 4,165,410 | 8/1979 | Blunk | 252/62.57 |

OTHER PUBLICATIONS

Glass et al., Temperature Stabilization of Ferrimagnetic Resonance Field in Epitarial YIG, by, Ga, La, Substitution, Pergamon Press, 5/1977.

*Primary Examiner*—Stanley S. Silverman
*Attorney, Agent, or Firm*—H. Frederick Hamann; Gilbert H. Friedman

[57] ABSTRACT

In the preferred embodiment, a monocrystalline film of substituted yttrium iron garnet (YIG) deposited on a <11> oriented gadolinium gallium garnet (GGG) substrate is formulated so that the temperature variation of the ferromagnetic resonance frequency of the film has an ordinary minimum. For a range of temperature variations about the temperature at which the minimum occurs, therefore, the resonance frequency of the film is relatively insensitive to variations in temperature. This minimum is believed to occur where the temperature variations of the demagnetizing effect and the temperature variations of anisotropy effects more or less counterbalance each other. The counter-balancing effects are brought within range of each other primarily by the substitution of gallium or aluminum for iron and substitution of lanthanum for yttrium in the substituted YIG. Gallium or aluminum reduces the temperature drift of the saturation magnetization. Lanthanum adjusts the misfit stress and thus the anisotropy effects.

6 Claims, 2 Drawing Figures

TEMPERATURE-STABILIZED LOW-LOSS FERRITE FILMS

The invention herein described was made in the course of or under a contract or subcontract thereunder with the Air Force.

BACKGROUND OF THE INVENTION

1. Field of the Invention

The invention relates to the field of magnetic materials and more particularly relates to ferrimagnetic films for microwave signal processing and transmission applications.

2. Background of the Invention

Ferrite single crystals are used in a number of microwave and millimeter-wave devices. Such devices generally operate at, or near, the ferromagnetic resonance frequency. It is important that this frequency be well defined; that is, the resonance should have a low linewidth (low loss) and the center frequency of the resonance should be insensitive to variations in temperature. The usual way to obtain temperature stability is to use a bulk single crystal of ferrite and to fabricate from this crystal a sphere having a well-polished surface.

The method of using a spherical sample to achieve temperature stability can be understood from the following equation for the resonance frequency:

$$\omega_r=\{[\gamma H_o+N_x^a\omega_M+(N_x-N_z)\omega_M][\gamma H_o+N_y^a\omega_M+(N_y-N_z)\omega_M]\}^{\frac{1}{2}} \quad (1)$$

("Microwave Ferrites and Ferrimagnetics", B. Lax and K. J. Button, McGraw-Hill (New York) 1962, eq. (4-32)). In this equation $\omega_r$ is the resonance frequency in angular units; $\gamma$ is the gyromagnetic ratio; $H_o$ is an externally applied d-c magnetic field; $N_x$, $N_y$ and $N_z$ are the demagnetizing factors determined by the shape of the sample; $N_x^a$, $N_y^a$ and $N_z^a$ are effective demagnetizing factors which describe the effects of magnetic anisotropy; $\omega_M=\gamma 4\pi M_o$ where $M_o$ is the magnetic moment per unit volume (or saturation magnetization) of the sample.

In most low-loss ferrites, such as YIG, the major source of temperature instability arises from the $\omega_M$ factors, since the magnetization $M_o$ varies rapidly with temperature. For a spherical sample, $N_x=N_y=N_z$ so that the terms $(N_x-N_z)\omega_M$ and $(N_y-N_z)\omega_M$ vanish. This removes the major part of the temperature sensitivity, since the anisotropy effects represented by $N_x^a\omega_M$ and $N_y^a\omega_M$ are smaller. These smaller anisotropy effects also can be made to vanish by rotating the sphere so that the applied d-c field $H_o$ lies along an optimum crystallographic direction of the ferrite. This optimum orientation can also compensate for other sources of temperature drift such as the small variation of $\gamma$ with temperature (R. E. Tokheim and G. F. Johnson, IEEE Trans. Mag., MAG-7 (1971) 267).

The fabrication and alignment of spherical ferrite crystals are tedious and costly processes. Moreover, it is difficult to incorporate spheres into the modern planar microwave and millimeter-wave circuit geometries. Ferrites in the form of single crystal films overcome these drawbacks. Moreover, there is a well-developed technology for producing useful ferrites as single crystal films. Unfortunately films, or discs fabricated from films, do not have a vanishing demagnetizing field contribution. For example, a thin disc which is oriented normal to the applied d-c field (taken to be the Z-axis) has demagnetizing factors $N_x=N_y=0$ and $N_z=1$. If the anisotropy is uniaxial along the film normal, then Equation (1) reduces to $$\omega_r=\gamma H_o+N_z^a\omega_M-\omega_M \quad (2)$$

or, equivalently, $$\omega_r/\gamma=H_o+H_a-4\pi M_o. \quad (3)$$

In Equation (3), $H_a$ is the anisotropy field. It represents the effects of anisotropy from all sources and is positive when the anisotropy creates an easy direction of magnetization along the normal to the film. In the case of the bulk crystals which are used for conventional sphere devices, $H_a$ arises from the cubic magnetocrystalline anisotropy. When the ferrite is in the form of a film which is deposited on a substrate, then the substrate may exert a stress on the film. This stress will modify the anisotropy. For example, for the film geometry described above, and assuming a crystallographic orientation with the <111> direction normal to the film, $$H_a=-\frac{4K_l}{3M_o}-\frac{3\sigma\lambda_{111}}{M_o} \quad (4)$$

(P. J. Besser, J. E. Mee, P. E. Elkins, and D. M. Heinz; Mat. Res. Bull. 6 (1971) 1111). In this equation, $K_1$ is the cubic anisotropy constant which describes the anisotropy effects which would also be found in spheres. The term $3\sigma\lambda_{111}/M_o$ represents the stress-induced anisotropy. $\sigma$ is the stress which the substrate exerts on the layer and $\lambda_{111}$ is the magnetostriction coefficient of the layer. In more general terms, we can write $$H_a=H_a^K+H_a^\sigma+H_a'. \quad (5)$$

$H_a^K$ represents the anisotropy arising from the inherent crystal structure. This structure is cubic in the case of YIG; but may have other symmetries for other ferrites. $H_a^\sigma$ represents the anisotropy arising from stress exerted on the ferrite film by the substrate. $H_a'$ represents other sources of anisotropy such as the so-called "growth induced" effects. The exact mathematical forms of these terms will depend on the crystal structures, crystal orientations and resonance geometries.

3. Prior Art Statement

The most pertinent prior art discovered by applicant relative to this invention is listed herewith.

Zneimer et al, U.S. Pat. No. 3,125,534, issued Mar. 17, 1964, discloses sintered polycrystalline ferrimagnetic garnet wherein low ferromagnetic resonance linewidth garnet such as yttrium iron garnet, lutecium iron garnet, or mixed yttrium-lutecium iron garnet may have its saturation magnetization lowered to a predetermined value and the temperature stability of the saturation magnetization correspondingly improved by the substitution of a predetermined quantity of gadolinium for the yttrium or lutecium. "Such temperature stability is obtained at some expense inasmuch as the line width increases as the gadolinium content is increased." (Column 6, lines 65-67.) Zneimer et al also suggests that the same effect may be obtained in an yttrium iron garnet having some aluminum partially substituted for iron.

Harrison et al, U.S. Pat. No. 3,132,105, issued May 5, 1964, discloses sintered polycrystalline ferrimagnetic garnet materials such as yttrium gadolinium iron garnet wherein varying amounts of aluminum and gallium are partially substituted for iron, varying amounts of dysprosium are partially substituted for yttrium, and varying amounts of gadolinium are partially substituted for yttrium to reduce the saturation magnetization and correspondingly increase the temperature stability of the saturation magnetization of the materials.

Schieber, U.S. Pat. No. 3,193,502, issued July 6, 1965, discloses ternary ferrimagnetic compositions of matter comprising either iron together with one element of Group III-B of the Periodic System (which includes lanthanum) and one element of the group strontium, barium, calcium and lead or iron together with two elements of Group III-B of the Periodic System either in combination with oxygen alone, or in combination with oxygen and fluorine.

Linares, U.S. Pat. No. 3,486,937, discloses the tipping method of liquid phase epitaxy (LPE) wherein monocrystalline thin films of ferrimagnetic materials are grown on single crystal substrates from fluxed melts. The ferrimagnetic materials are ferrimagnetic garnets, ferrimagnetic spinels, and ferrimagnetic hexagonals. For the garnets, the iron may be mixed with aluminum, gallium, scandium, chromium, or cobalt.

Le Craw, U.S. Pat. No. 3,495,189, issued Feb. 10, 1970, discloses bulk single-crystal iron-containing ferrimagnetic garnet having selected nonmagnetic ions, notably gallium and aluminum but also vanadium, substituted for some of the iron therein primarily on the tetrahedral sites of the crystal. Le Craw teaches that the effect of such substitution is to decrease the saturation magnetization of the garnet to a desired lower value. Le Craw further teaches that substitution of the selected nonmagnetic ions reduces the Curie (or Néel) temperature and that substitutions beyond a certain amount result in increasing temperature sensitivity and are particularly undesirable for room temperature operation (Col. 4, lines 31–42). In addition, Le Craw teaches that, in general, the very large class of rare-earth iron garnets, except for yttrium iron garnet (YIG) and lutecium iron garnet, have significant loss mechanisms associated with their cations.

Kolb et al, U.S. Pat. No. 3,496,108, issued Feb. 17, 1970, discloses a hydrothermal method for growing bulk single-crystal ferrimagnetic garnet such as YIG and partially substituted YIG wherein at least one of the trivalent rare-earth elements, including lanthanum, may be partially substituted for the yttrium and wherein gallium and/or aluminum may be partially substituted for the iron.

Heinz, U.S. Pat. No. 3,995,093, issued Nov. 30, 1976, discloses a garnet bubble domain material for high frequency operation exhibiting a relatively high uniaxial anisotropy having contributions from cubic, stress-induced, and growth-induced anisotropy effects. Heinz teaches that the magnitude of the stress-induced effect is generally limited because stress must be kept small enough that film cracking does not result. Heinz teaches making the growth-induced effect relatively large to produce high uniaxial anisotropy. The preferred material includes both lanthanum and lutecium on the dodecahedral lattice sites and a nonmagnetic ion having a charge of +3, preferably gallium, and iron on the tetrahedral lattice sites. The non-magnetic ion reduces the saturation magnetization of the material. In a more general case, where iron substitution is achieved with an ion having a charge of greater than +3 on tetrahedral lattice sites, a charge compensating ion having a charge of +1 or +2 is also substituted on the dodecahedral lattice sites. The lanthanum and lutecium are preferred, in part because they are non-magnetic. The relative proportions of the various ions are chosen to produce a selected saturation magnetization and a small misfit, or mismatch, between the lattice constant of the bubble domain film and the lattice constant of the single crystal substrate.

Hoekstra et al, "The Origin of Uniaxial Anisotropy in Thin Films of $(YLaPb)_3 (FeGa)_5O_{12}$ and its Variation Along the Growth Direction", Mat. Res. Bull., Vol. 12, pp. 53–64, 1977, discloses that the uniaxial anisotropy of films of YIG doped with lanthanum and gallium and grown at temperatures above 870° C. is primarily the result of stress-induced anisotropy. The relatively high growth temperature is used to eliminate growth-induced anisotropy resulting from the incorporation of lead from lead-oxide based flux in the films. The compositions disclosed have the general formula $Y_{3-x-z}La_xPb_zFe_{5-y}Ga_yO_{12}$ where x is about 0.2 atoms of lanthanum per formula unit, z is from zero to 0.1 atoms of lead per formula unit, and y is about 1.25 atoms of gallium per formula unit.

SUMMARY OF THE INVENTION

The essential element of the invention is that the signs and magnitudes of the anisotropy fields can be controlled during preparation of the ferrite film. In particular, the sign and magnitude of the stress $\sigma$ can be controllably selected to achieve temperature stability of the resonance frequency.

We can illustrate this for the specific case of a <111> film in the form of a thin disc oriented normal to the applied d-c field (perpendicular resonance). If $H_a'$ is negligible compared with $H_o^K$ and $H_o^\sigma$, then Equations (3) through (5) give $$\frac{\omega_r}{\gamma} = H_o - \frac{4}{3}\frac{K_l}{M_o} - \frac{3\sigma\lambda_{111}}{M_o} - 4\pi M_o. \quad (6)$$

Assuming that $\gamma$, $H_o$, and $\sigma$ have negligible variations with temperature, then the temperature derivative of Equation (6) is $$\frac{l}{\gamma}\frac{\partial\omega_r}{\partial T} = -\frac{4}{3M_o}\frac{\partial K_l}{\partial T} - \frac{3\sigma}{M_o}\frac{\partial\lambda_{111}}{\partial T} + \left\{\frac{4}{3}\frac{K_l}{M_o^2} + \frac{3\sigma\lambda_{111}}{M_o^2}4\pi\right\}\frac{\partial M_o}{\partial T}. \quad (7)$$

If the sign and magnitude of $\sigma$ can be chosen at will, then for any ferrite with given $K_1$, $\lambda_{111}$, $M_o$, and their temperature derivatives, $\partial\omega_r/\partial T$ can be made to vanish. The effects of non-negligible temperature variations in $\gamma$, $\sigma$, and $H_o$, and the effects of small but non-negligible $H_a'$, can also be compensated through adjustment of the choice of the sign and magnitude of $\sigma$.

As a more specific example, consider YIG. For this material at room temperature, $K_1 = -6000$ erg/cm$^3$, $\lambda_{111} = -2.4\times10^{-6}$, $M_o = 142$ gauss. Also $\partial K_1/\partial T \simeq +60$ erg/cm$^3$°K; $\partial\lambda_{111}/\partial T \simeq +12\times10^{-9}$/°K; $\partial M_o/\partial T = -0.31$ g/°C. Then, inserting these values and measuring $\sigma$ in units of $10^9$ dyne/cm$^2$, $$\partial\omega_r/\partial T = -0.56 - 0.25\sigma - \{-0.40 - 0.36\sigma - 12.6\}0.31 \quad (8)$$

$$\partial\omega_r/\partial T=3.5-0.14\sigma \quad (9)$$

and the frequency will be insensitive to temperature variations (around room temperature) when $$\sigma=+25\times10^9 \text{ dyne/cm}^2. \quad (10)$$

The plus in Equation (10) represents tensile stress in the film. Tensile stresses of the magnitude given in (10) are generally practicable only in very thin films; films of more substantial thickness are likely to crack or degrade in some other fashion. It is apparent from Equations (7) through (9), that for the particular case of <111> YIG films, temperature stability can be achieved at lower values of tensile stress if $M_o$ and $\partial M_o/\partial T$ are reduced in magnitude. Then the quantity 3.5 in Equation (9) will be replaced by a smaller value and the coefficient 0.14 which multiplies $\sigma$ in Equation (9) will be replaced by a larger value. The magnitudes of $M_o$ and $\partial M_o/\partial T$ can be reduced by adjusting the chemical composition of the YIG. In general, the other parameters will also be altered; but the stress can still be adjusted to achieve temperature stability. In examples given hereinafter, Ga is substituted for Fe in YIG and La is substituted for Y. These substitutions reduce the magnitude of $M_o$ and $\partial M_o/\partial T$ and yield the values of $\sigma$ required for temperature stability for perpendicular resonance of layers grown on <111> GGG substrates. Other resonance geometries, orientations, substrates and film compositions could also have been used; however, epitaxial ferrite technology is most highly developed for growth of YIG on <111> GGG.

Stated alternatively, the invention is a specially formulated thin film of monocrystalline ferrimagnetic material deposited on a single crystal substrate. The ferromagnetic resonance frequency of the film is temperature stabilized by bringing the temperature variation of the anisotropy effect and the temperature variation of all other factors affecting resonance frequency such as, for example, the demagnetizing field within range of each other so that they more or less counterbalance each other in their effect on ferromagnetic resonance frequency. A film formulated according to the subject invention exhibits an ordinary extremum in its characteristic curve of variation of ferromagnetic resonance frequency with temperature. As an additional feature, the film is preferably formulated to have a small ferromagnetic resonance line width so that its losses at microwave frequencies will be small.

The ferrimagnetic material may be a garnet-structured ferrite, a spinel-structured ferrite including lithium ferrite, a hexagonal ferrite, or an orthoferrite. The single crystal substrate may be from the group consisting of rare-earth gallium garnets, mixed rare-earth gallium garnets, rare-earth aluminum garnets, mixed rare-earth aluminum garnets, magnesium oxide, gallate spinels such as, for example, zinc gallate, $ZnGa_2O_4$, or magnesium gallate, $MgGa_2O_4$, indium-gallate spinels such as, for example, magnesium indium-gallate, $Mg(In,Ga)_2O_4$, aluminate spinels such as, for example, zinc aluminate spinel, and sapphire. As used herein, the rare earths include yttrium and lanthanum. Non-garnet films are typically deposited on non-garnet substrates.

The film is placed on the substrate by any deposition method which produces a monocrystalline film on a single crystal substrate.

In the preferred embodiment, the ferrimagnetic material is a magnetic garnet such as, for example, substituted yttrium iron garnet (YIG) epitaxially deposited on a <111> gadolinium gallium garnet (GGG) substrate. The preferred deposition technique is the isothermal dipping method of liquid phase epitaxy using a lead-oxide based fluxed melt.

Diamagnetic ions having a strong tetrahedral-site preference are substituted for some of the iron in the YIG to reduce the saturation magnetization and, proportionally, the demagnetizing field. The result is that the temperature variations of these quantities are also reduced. The amount of diamagnetic ion substitution is a value which results in the deposited film having a lattice parameter less than that of the substrate so that the film is subjected to a tensile misfit stress. Tensile misfit stress produces the conditions for counterbalancing of temperature variations of demagnetizing effect and anisotropy effects. The stress in the film must not be so large as to cause the film to crack or peel from the substrate.

The preferred diamagnetic ions for iron substitution on the tetrahedral sites in YIG are gallium or aluminum. Insufficient amounts of the substituting material tend to require excessively large tensile stresses for counterbalancing the temperature variation of the demagnetizing field with the temperature variation of the anisotropy effects. Amounts of the substituting material larger than desirable limits tend to reduce both the saturation magnetization and the Néel (or Curie) temperature excessively. Under the latter conditions, microwave frequency losses are significantly increased.

In the preferred embodiment, amounts of gallium in the range from about 0.6 atoms per formula unit to about 1.4 atoms per formula unit are substituted for iron on the tetrahedral sites of YIG.

For each specific value of the quantity of diamagnetic ion on the tetrahedral sites of the magnetic garnet, there exists a specific value of tensile stress because of misfit between the film and the substrate which will produce a condition of precisely counterbalanced temperature drifts at a given temperature. The temperature at which this zero drift occurs can be selected by adjustment of the lattice parameters of the film or substrate or of both of these. For the preferred <111> GGG ($Gd_3Ga_5O_{12}$) substrates, the lattice parameter of a magnetic garnet film can be adjusted to a desired value by the substitution therein of an appropriate amount of a relatively large ion having a strong dodecahedral-site preference. To keep losses and linewidth relatively low, this ion is preferably a non-magnetic one. Where the film is of substituted YIG, this substituent is preferably lanthanum.

DESCRIPTION OF THE PREFERRED EMBODIMENTS

Figure 1:
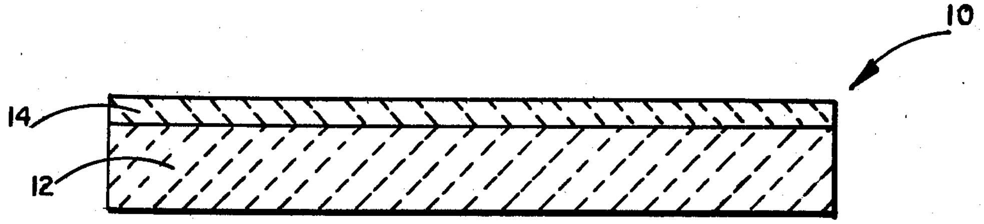
FIG. 1 shows a cross section of a ferrimagnetic film formulated in accordance with the invention disposed on a substrate.

In FIG. 1, there is shown a composite 10 in accordance with the subject invention. The composite 10 includes a single crystal substrate 12 and a thin film 14 of ferrimagnetic material disposed on the substrate. For the film 14 of a magnetic garnet, the substrate 12 may be of a rare earth gallium garnet or a mixed rare earth gallium garnet such as, for example, $(Dy,Gd)_3Ga_5O_{12}$. The choice of a particular material for the substrate 12 will depend in part on the choice of the particular material for the film 14 which will be deposited thereon. It is desired to obtain a particular selected lattice parameter misfit between the substrate 12 and the film 14. Therefore, one of the factors to be considered in selecting a material for the substrate 12 is the lattice parameter of that material's crystal structure. The choice is further influenced by the characteristics of the film 14 in that for some film materials, it may be desired to have a compressive stress be applied and for others it may be desired that a tensile stress be applied. This depends on which type of stress on the film 14 produces anisotropy effects the temperature variations of which will tend to counterbalance the temperature variations of all of the other factors affecting resonance frequency.

As has been mentioned, a GGG substrate 12 is used in the preferred embodiment when the film 14 is a La,Ga:YIG. In this case, it is desired to produce a tensile stress on the film 14 in order to produce temperature variations of the anisotropy effects which will more or less counterbalance the dominant magnetization temperature variations at a selected temperature.

At present, YIG is preferred for the film 14 because techniques for the growth of high quality single crystal films are most highly developed for this material.

The film 14 of La,Ga:YIG for the preferred embodiment is preferably deposited on a <111> face of the GGG substrate 12 by the method of liquid phase epitaxy from a lead-oxide based fluxed melt. Again, this embodiment is preferred mainly because the use of <111> GGG and lead-oxide based fluxes represents the most highly developed technique. The growth temperature is kept relatively high to confine the anisotropy effects, as much as is conveniently practical, to stress-induced anisotropy. The amount of undercooling relative to the saturation temperature of the fluxed melt is also kept as small as is practical to keep the amount of lead incorporated into the film low. This prevents the development of large growth-induced anisotropy so that the quantity $H_a'$ in Equation 5 is negligible. However, the amount of Pb present in the films is large enough to affect the stress.

Certain experiments in growing ferrimagnetic films 14 in accordance with this invention have been conducted and measurements of the characteristics of these films 14 were made. The experiments, the measurements, and the theory of the invention are discussed in Glass et al, "Temperature Stabilization of Ferrimagnetic Resonance Field in Epitaxial YIG by Ga,La Substitution", Mat. Res. Bull., July 1977, Vol. 12, pp. 735–746. This article is hereby incorporated by reference into this specification in its entirety for the discussions listed above.

In the aforementioned experiments, a number of different Ga,La substituted YIG films 14 were grown on the <111> faces of GGG substrates 12 by the isothermal dipping method of liquid phase epitaxy. The fluxed melt had the following approximate composition: PbO, 1250 g; $B_2O_3$, 24 g; $Fe_2O_3$, 90 g; $Ga_2O_3$, 8.1 g; $Y_2O_3$, 5.3 g; $La_2O_3$, 1.3 g. During the course of the growth experiments, the saturation temperature of the fluxed melt varied from about 941° C. to about 949° C. The growth temperature varied from about 5° C. to about 58° C. of undercooling.

Two of the films grown are not discussed here. In one case, the film composition did not lead to temperature stability. In the other case, the resonance measurements were not reproducible. However, ferrimagnetic resonance measurements were obtained for four films 14 which are presented in FIG. 2. In addition to the data presented in FIG. 2, ferrimagnetic resonance linewidth data was obtained. The room-temperature linewidth of the films grown was found to vary from about 1.1 Oe to about 5.5 Oe. The films 14 having the larger lattice parameter mismatch had the larger linewidths.

Using the experimentally grown films 14, film thicknesses were measured by optical interference in the near infra-red. Film-substrate lattice parameter differences were measured by X-ray double-crystal diffraction. Néel temperatures were obtained from Faraday rotation. Ferrimagnetic resonance measurements were made over a temperature range from minus 80° C. to plus 160° C. Ferrimagnetic resonance spectra were obtained with a sample inside a rectangular $TE_{102}$ cavity in both perpendicular (externally applied fixed magnetic field applied normal to the film 14) and parallel (externally applied fixed magnetic field applied in the plane of the film 14) configurations. As may be seen in the above-referenced paper, Glass et al, the data obtained in parallel resonance indicated a reduction in temperature variation of resonance frequency but no extremum appeared in the data. The data presented in FIG. 2 was obtained for perpendicular resonance.

The gallium content, lanthanum content, and the spontaneous magnetization of the experimentally grown films 14 were calculated from the above-mentioned measured parameters and other data as set forth in Glass et al.

Figure 2:
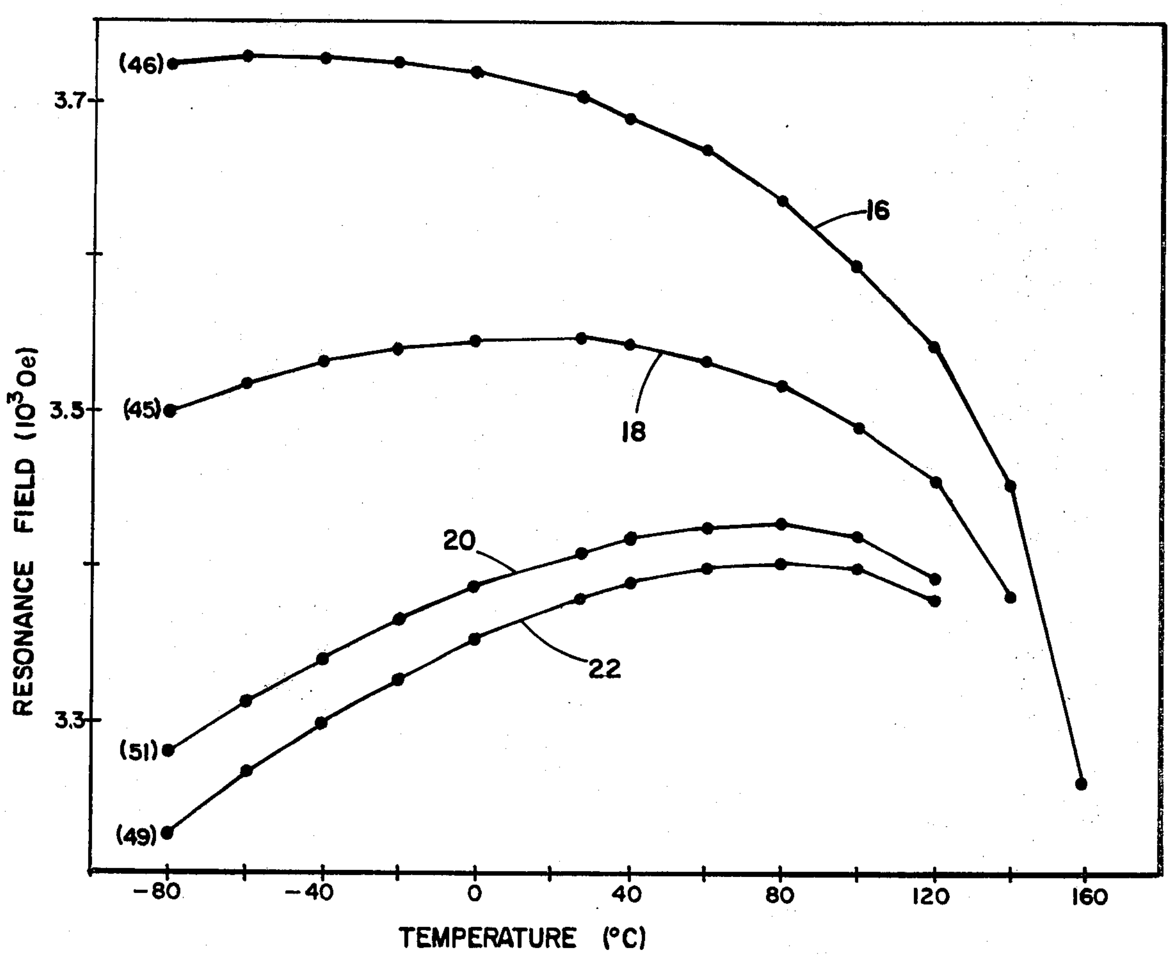
FIG. 2 shows curves, experimentally obtained from film samples formulated in accordance with the invention, showing the variation of the externally applied constant magnetic field required to maintain ferromagnetic resonance frequency in perpendicular resonance constant as temperature is varied.

FIG. 2 shows curves 16, 18, 20 and 22 for the variation of the externally applied resonance field required to maintain the resonance frequency, 9.1 GHz, in perpendicular resonance constant as temperature is varied. The above-listed curves correspond to sample numbers 46, 45, 51 and 49, respectively, of the Glass et al paper. These sample numbers are indicated in parentheses at the left side of each of the curves. Each of curves 16, 18, 20 and 22 shows a fairly broad ordinary maximum over a substantial range of temperatures. Use of the term "ordinary" maximum, minimum, or extremum herein is intended to denote a point on a curve which has zero slope and at which all higher derivatives are finite and continuous. The appearance of an ordinary maximum in curves 16, 18, 20, and 22 is the equivalent of a showing that an ordinary minimum would also appear in curves showing a variation in resonance frequency as externally applied field is held fixed and as temperatures varied. A variation of 1 Oe in curves 16, 18, 20, and 22 is the equivalent of a variation of 2.8 MHz in curves showing variations in resonance frequency for fixed field.

Curve 16 (sample 46) presents data for a composite 10 having a film 14 thereon deposited at a growth temperature of 901.0°±0.5° C. This curve shows a resonance field maximum at about minus 50° C. Néel temperature for this sample was measured to be 457.5°±0.5° K. The perpendicular component of film-substrate lattice parameter mismatch, or misfit, was measured to be +0.0046±0.0004 angstroms. Calculations indicate that this film has a room temperature demagnetizing field ($4\pi M_o$) of about 491 gauss and the formula $La_{0.12}Y_{2.8}$-

$_8Ga_{0.81}Fe_{4.19}O_{12}$ without correction for lead incorporation.

Curve 18 (sample 45) presents data for a composite 10 having a film 14 thereon deposited at a growth temperature of 931.0°±0.5° C. This curve shows a resonance field maximum at about 14° C. (near room temperature) with a maximum field of 3545 Oe. The field diminishes to 3544 Oe at 0° C. and 28° C. The equivalent maximum variation in resonance frequency over this temperature range would be 2.8 MHz. The latter variation would be equivalent to a filter having a linear drift of 0.1 MHz/°C. Néel temperature for this sample was measured to be 446.5°±0.5° K. The perpendicular component of film-substrate lattice parameter mismatch was measured to be +0.0195±0.0004 angstroms. Calculations indicate that this film has a room temperature demagnetizing field ($4\pi M_o$) of about 410 gauss and the formula $La_{0.06}Y_{2.94}Ga_{0.87}Fe_{4.13}O_{12}$ without correction for lead incorporation.

Curve 20 (sample 51) presents data for a composite 10 having a film 14 thereon deposited at a growth temperature of 940.5°±0.5° C. This curve shows a resonance field maximum at about 80° C. Néel temperature for this sample was measured to be 443.5°±0.5° K. The perpendicular component of film-substrate lattice parameter mismatch was measured to be +0.0251±0.0004 angstroms. Calculations indicate that this film has a room temperature demagnetizing field ($4\pi M_o$) of 389 gauss and the formula $La_{0.04}Y_{2.96}Ga_{0.89}Fe_{4.11}O_{12}$ without correction for lead incorporation.

Curve 22 (sample 49) presents data for a composite 10 having a film 14 thereon deposited at a growth temperature of 943.5°±0.5° C. This curve shows a resonance field maximum at about 80° C. Néel temperature for this sample was measured to be 442.0°±0.5° K. The perpendicular component of film-substrate lattice parameter mismatch was measured to be +0.0263±0.0004 angstroms. Calculations indicate that this film has a room temperature demagnetizing field ($4\pi M_o$) of about 379 gauss and the formula $La_{0.03}Y_{2.97}Ga_{0.90}Fe_{4.10}O_{12}$ without correction for lead incorporation.

While the invention has been described in its preferred embodiments, it is understood that the words which have been used are words of description rather than of limitation and changes within the purview of the appended claims may be made without departing from the true scope and spirit of the invention in its broader aspects.

What is claimed is:

1. A composite comprising:

a single-crystal, wherein said substrate is of a material selected from the group consisting of the rare-earth gallium garnets, the mixed rare-earth gallium garnets, the rare-earth aluminum garnets, the mixed rare-earth aluminum garnets, magnesium oxide, the gallate spinels, the indium-gallate spinels, the aluminate spinels, and sapphire;

a monocrystalline film of ferrimagnetic material deposited on said substrate, wherein said ferrimagnetic material is selected from the group consisting of garnet-structured ferrites, spinel-structured ferrites, hexagonal ferrites, and orthoferrites, and wherein a selected amount of a diamagnetic ion is substituted for iron in said ferrimagnetic material, said film having an ordinary extremum at a selected temperature in its variation of ferromagnetic resonance frequency with variations of temperature;

wherein a substrate-film lattice parameter mismatch exists between said substrate and said film whereby stress is established in said film; and wherein the amount of said substrate-film lattice parameter mismatch and said selected amount of a diamagnetic ion are jointly selected to cause said ordinary extremum in the variation of ferromagnetic resonance frequency of said film with variations in temperature to be at said selected temperature.

2. A composite as recited in claim 1 wherein:

said film is of a substituted iron garnet of a first non-magnetic rare earth wherein said first non-magnetic rare earth is yttrium; and an amount of an ion of a second non-magnetic rare earth, different from said first non-magnetic rare earth, is substituted for no more than about 0.3 ions per formula unit of said first non-magnetic rare earth in said substituted iron garnet.

3. The composite recited in claim 2 wherein said amount of said ion of a second non-magnetic rare earth is selected to adjust said value for said substrate-film lattice parameter mismatch to cause said ordinary extremum to be an ordinary minimum at said selected temperature.

4. A composite as recited in claim 3 wherein:

said substrate is of gadolinium gallium garnet and is cut along a <111> face thereof;

said film is of substituted yttrium iron garnet;

said diamagnetic ion is selected from the group consisting of gallium and aluminum; and said second non-magnetic rare earth is lanthanum.

5. A composite as recited in claim 4 wherein:

said film is deposited by liquid phase epitaxy from a lead-oxide based fluxed melt; and said amount of said diamagnetic ion is gallium in the range from about 0.6 to about 1.4 ions thereof per formula unit.

6. A composite as recited in claim 5 wherein:

said substituted yttrium iron garnet has the general formula $La_xY_{3-x}Ga_zFe_{5-z}O_{12}$; and said substituted yttrium iron garnet is selected from the group consisting of $La_{0.12}Y_{2.88}Ga_{0.81}Fe_{4.19}O_{12}$, $La_{0.06}Y_{2.94}Ga_{0.87}Fe_{4.13}O_{12}$, $La_{0.04}Y_{2.96}Ga_{0.89}Fe_{4.11}O_{12}$, and $La_{0.03}Y_{2.97}Ga_{0.90}Fe_{4.10}O_{12}$.

* * * * *